(12) United States Patent
Tsuzaki

(10) Patent No.: US 9,829,514 B2
(45) Date of Patent: Nov. 28, 2017

(54) CURRENT DETECTION CIRCUIT

(71) Applicant: SII Semiconductor Corporation, Chiba-shi, Chiba (JP)

(72) Inventor: Toshiyuki Tsuzaki, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 142 days.

(21) Appl. No.: 15/070,139

(22) Filed: Mar. 15, 2016

(65) Prior Publication Data

US 2016/0274151 A1 Sep. 22, 2016

(30) Foreign Application Priority Data

Mar. 19, 2015 (JP) ................................. 2015-056465

(51) Int. Cl.
 *G01R 19/00* (2006.01)
 *G01R 31/02* (2006.01)

(52) U.S. Cl.
 CPC ........ *G01R 19/0092* (2013.01); *G01R 31/025* (2013.01)

(58) Field of Classification Search
 CPC ............... H01L 27/105; H01L 27/0266; H01L 29/0847; H01L 29/78; H01L 27/0292; H02H 9/025; H02H 1/06; H02H 1/066; H02H 1/043; H02H 3/16; H02H 3/36; H02H 3/44; H02H 3/50; H04L 25/0294; H04L 25/08; G01R 19/0092; G01R 31/025; G01R 19/2513; G01R 21/06; G01R 21/133; G01R 15/186; G01R 19/14; G01R 21/00; G01R 23/173; G01R 31/1272; H03F 1/223; H03K 17/302; H03K 2017/307; H03K 3/356113; H03K 17/0826; H03K 2217/0036; H03K 5/153; G06F 3/038; H01B 11/06; H01H 2009/543; H01H 2071/006; H01H 9/30; H01H 9/542; H02J 3/36; H02J 7/025
 See application file for complete search history.

(56) References Cited

U.S. PATENT DOCUMENTS

| 5,668,770 | A | * | 9/1997 | Itoh ....................... G11C 11/412 257/903 |
| 5,969,574 | A | | 10/1999 | Legates |
| 7,710,152 | B1 | * | 5/2010 | El Bacha ......... H03K 3/356113 326/68 |
| 2011/0234319 | A1 | * | 9/2011 | Tsuzaki ............... H03F 3/45179 330/257 |

* cited by examiner

*Primary Examiner* — Vinh Nguyen
(74) *Attorney, Agent, or Firm* — Brinks Gilson & Lione

(57) ABSTRACT

To provide a current detection circuit which suppresses a change in characteristics of a PMOS transistor on the non-inversion input terminal side of a differential amplifier due to NBTI and causes no change in threshold value at which an output voltage of the current detection circuit is inverted. A voltage limiting circuit which limits a voltage drop is provided between a non-inversion input terminal of a differential amplifier and a source of a PMOS transistor on the inversion input terminal side.

3 Claims, 4 Drawing Sheets

CURRENT DETECTION CIRCUIT

RELATED APPLICATIONS

This application claims priority under 35 U.S.C. §119 to Japanese Patent Applications No. 2015-056465 filed on Mar. 19, 2015, the entire content of which is hereby incorporated by reference.

BACKGROUND OF THE INVENTION

Field of the Invention

The present invention relates to a current detection circuit which monitors a current, and more specifically to a circuit which measures a voltage across a resistor inserted into a power supply line by a differential amplifier and outputs a measurement result.

Background Art

Monitoring a current in a power supply line is important as means for detecting abnormalities such as a short circuit of the power supply line to a ground line, disconnection of parts connected to the power supply line, etc.

A circuit diagram of a related art current detection circuit is illustrated in FIG. 3. The related art current detection circuit is equipped with a resistor 301 for converting a current flowing through a power supply line 300 into a voltage, and a differential amplifier 320 for amplifying a difference in voltage between both ends of the resistor 301. The differential amplifier 320 is comprised of resistors 306 and 307, PMOS transistors 308 and 309, current sources 310 and 311, a non-inversion input terminal 303, an inversion input terminal 302, and an output terminal 304.

Such a current detection circuit as described above is operated in the following manner and has a function of monitoring the current.

When the current in the direction of an arrow flows through the resistor 301 ($I_S$=+ current), it is shown that since the non-inversion input terminal 303 is at a higher voltage than the inversion input terminal 302, and a source-gate voltage of the PMOS transistor 309 is larger than a source-gate electrode of the PMOS transistor 308, the voltage of the output terminal 304 is raised so that a + current flows.

When the current flows through the resistor 301 in the direction opposite to the arrow ($I_S$=− current), it is shown that since the inversion input terminal 302 is at a higher voltage than the non-inversion input terminal 303, and the source-gate voltage of the PMOS transistor 309 is smaller than the source-gate voltage of the PMOS transistor 308, the voltage of the output terminal 304 is lowered so that a − current flows.

When the resistors 306 and 307 are equal in resistance value, the PMOS transistors 308 and 309 are equal in characteristics, and the current sources 310 and 311 are equal in current value, a threshold value at which the voltage of the output terminal 304 is inverted becomes a condition ($I_S$=0 mA) that no current flows through the resistor 301.

[Patent Document 1] U.S. Pat. No. 5,969,574, Specification

SUMMARY OF THE INVENTION

The current detection circuit is however accompanied by a problem that the characteristics of the PMOS transistor 309 changes due to NBTI, so that the threshold value at which the voltage of the output terminal 304 of the current detection circuit is inverted changes. The operation of the current detection circuit will be described below.

NBTI is a phenomenon that when a minus voltage is continuously applied to the gate of a transistor with respect to the substrate of the transistor, i.e., a plus voltage is continuously applied to the substrate with respect to the gate thereof, the threshold voltage of the transistor changes. Since the larger a difference in voltage becomes, the greater a change in threshold voltage becomes, a reduction in voltage difference is considered as one means for preventing such a phenomenon.

FIG. 4 illustrates operating waveforms where assuming that the voltage of the non-inversion input terminal 303 is a constant voltage, the resistance value of the resistor 301 is $R_S$, and the current flowing through the resistor 301 is $I_S$ the $I_s$ current is changed. When the resistors 306 and 307 are equal in resistance value as R, the PMOS transistors 308 and 309 are equal in characteristics, the current sources 310 and 311 are equal in current value as I, and the voltage of the non-inversion input terminal 303 is defined as VIN+, a source voltage ($V_{S3}$) of the PMOS transistor 309 is expressed as follows:

$$V_{S3}=(VIN+)-(I \times R)$$

Also assuming that a source-gate voltage of the PMOS transistor 308 is $V_{SG31}$, a gate voltage ($V_{G3}$) of the PMOS transistors 308 and 309 when the current $I_S$ is changed is expressed as follows:

$$V_{G3}=(VIN+)-(I_S \times R_S)-(I \times R)-(V_{SG31})$$

From the above, a source-gate voltage $V_{SG32}$ of the PMOS transistor 309 is expressed as follows:

$$V_{SG32}=(V_{S3})-(V_{G3})=(I^S \times R_S)+(V_{SG31})$$

Thus, $V_{SG32}$ becomes large in proportion to an increase in $I_S$. Therefore, a problem arises that the characteristics of the PMOS transistor 309 change due to NBTI, and hence the inverted threshold value of the current detection circuit changes.

The present invention provides a current detection circuit which has solved the above problems.

In order to solve the related art problems, the current detection circuit of the present invention is configured as follows:

The current detection circuit is provided which includes a sense resistor provided in a power supply line, and a differential amplifier which detects a current flowing through the power supply line by a voltage across the sense resistor, and in which the differential amplifier includes a first resistor, a first PMOS transistor, and a first current source which are connected in series between an inversion input terminal and GND, and includes a second resistor, a second PMOS transistor, and a second current source which are connected in series between a non-inversion input terminal and GND, in which the first PMOS transistor has a gate and a drain connected to a gate of the second PMOS transistor, and the second PMOS transistor has a drain connected to an output terminal of the differential amplifier, and in which a voltage limiting circuit which limits a voltage drop is provided between the non-inversion input terminal and a source of the first PMOS transistor.

According to the current detection circuit of the present invention, an effect is brought about that since it is possible to limit a voltage drop at the gate of a PMOS transistor according to the voltage of a non-inversion input terminal, a change in the characteristics of the PMOS transistor on the non-inversion input terminal side of a differential amplifier due to NBTI is suppressed, and hence an inverted threshold value of the current detection circuit does not change.

DETAILED DESCRIPTION OF THE PREFERRED EMBODIMENTS

The present embodiments will hereinafter be described with reference to the accompanying drawings.

First Embodiment

Figure 1:
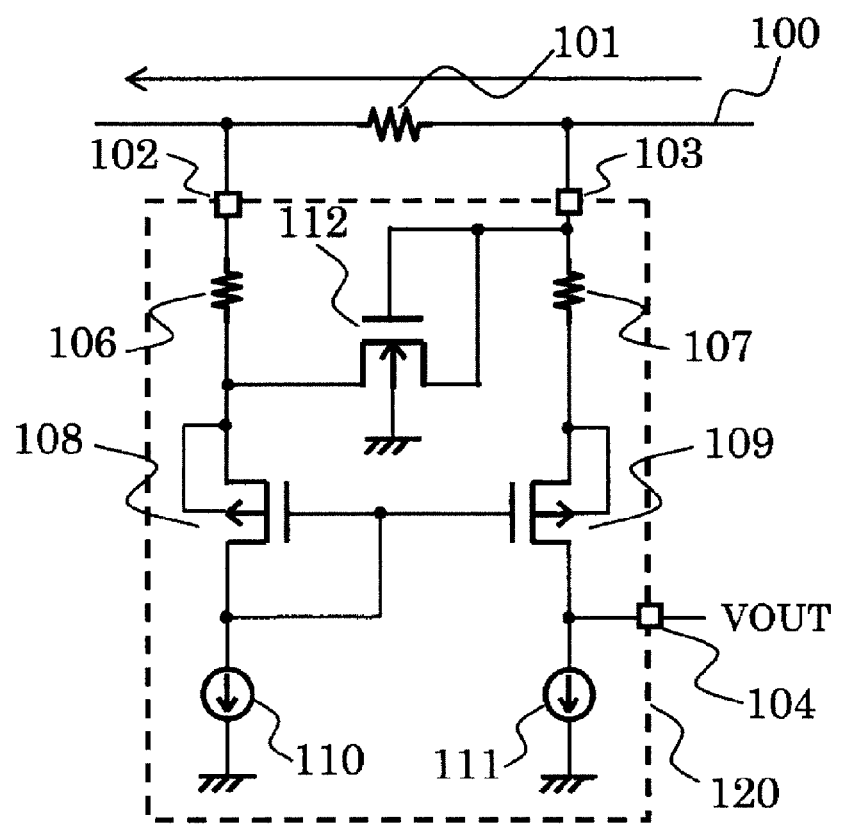
FIG. 1 is a circuit diagram of a current detection circuit according to a first embodiment.

FIG. 1 is a circuit diagram of a current detection circuit according to a first embodiment.

The current detection circuit according to the first embodiment is equipped with a resistor 101 as a sense resistor, and a differential amplifier 120. The differential amplifier 120 is equipped with resistors 106 and 107, PMOS transistors 108 and 109, current sources 110 and 111, and an NMOS transistor 112.

The resistor 101 converts a current flowing through a power supply line 100 into a voltage. The differential amplifier 120 detects the voltage generated in the resistor 101.

The resistor 101 is connected to a non-inversion input terminal 103 and an inversion input terminal 102 of the differential amplifier 120 at both ends thereof.

The resistor 106 has one terminal connected to the inversion input terminal 102, and the other terminal connected to a source of the PMOS transistor 108. The resistor 107 has one terminal connected to the non-inversion input terminal 103, and the other terminal connected to a source of the PMOS transistor 109. The PMOS transistor 108 has a gate and a drain connected to one terminal of the current source 110 and a gate of the transistor 109. The PMOS transistor 109 has a drain connected to one terminal of the current source 111 and an output terminal 104. The NMOS transistor 112 has a gate and a drain connected to the non-inversion input terminal 103, and a source connected to the source of the PMOS transistor 108, A substrate is connected to GND.

Figure 4:
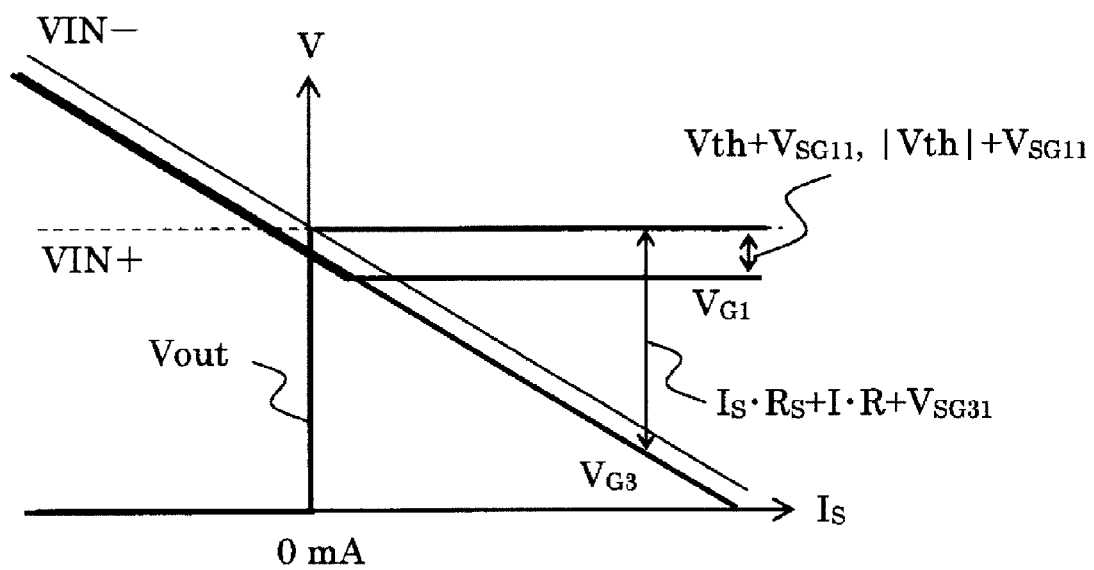
FIG. 4 is a waveform illustrating the operation of a current detection circuit.

FIG. 4 illustrates operating waveforms where assuming that the voltage of the non-inversion input terminal 103 is a constant voltage, the resistance value of the resistor 101 is $R_S$, and the current flowing through the resistor 101 is $I_S$, the current $I_S$ is changed. When the resistors 106 and 107 are equal in resistance value as R, the PMOS transistors 108 and 109 are equal in characteristics, the current sources 110 and 111 are equal in current value as I, and the voltage of the non-inversion input terminal 103 is defined as VIN+, a source voltage $V_{S1}$ of the PMOS transistor 109 is expressed as follows:

$$V_{S1}=(VIN+)-I\times R$$

Also assuming that a source-gate voltage of the PMOS transistor 108 is $V_{SG11}$, a gate voltage $V_{G1}$ of the PMOS transistors 108 and 109 when the current $I_S$ is changed is expressed as follows:

$$V_{G1}=(VIN+)-I_S\times R_S-I\times R-V_{SG11}$$

From the above, a source-gate voltage $V_{SG12}$ of the PMOS transistor 109 is expressed as follows:

$$V_{SG12}=V_{S1}-V_{G1}=I_S\times R_S+V_{SG11}$$

It is understood that when the current $I_S$ is increased to plus, the gate voltage $V_{G1}$ drops, and the source-gate voltage $V_{SG12}$ increases.

Here, since the NMOS transistor 112 is connected, the voltage drop of the gate voltage $V_{G1}$ is limited. The NMOS transistor 112 has transistor characteristics which allow a sufficient current to flow. Assuming that the threshold voltage of the NMOS transistor 112 is Vth, the following equation is established:

$$V_{G1}'=(VIN+)-V\text{th}-V_{SG11}$$

Thus, the voltage drop is limited by this voltage. From the above, the source-gate voltage $V_{SG12}$ of the PMOS transistor 109 is represented by the following equation:

$$V_{SG12}'=V_{S1}-V_{G1}'=V\text{th}+V_{SG11}-I\times R$$

Thus, the source-gate voltage $V_{SG12}$ is prevented from becoming a voltage not greater than a constant value regardless of the current $I_s$ even when the current $I_S$ is increased to plus.

Thus, since a change in the characteristics of the PMOS transistor 109 of the differential amplifier due to NBTI is suppressed, the current detection circuit does not change the threshold value at which its output voltage is inverted. On the other hand, when the current $I_S$ is increased to minus, it does not affect the circuit operation of the current detection circuit.

Figure 2:
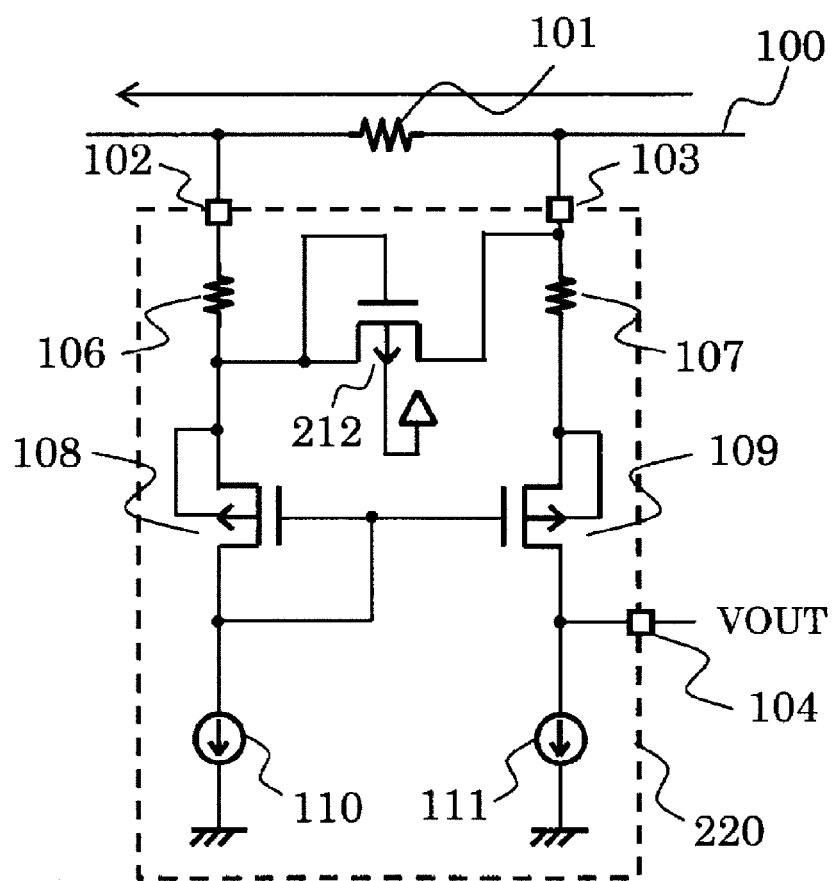
FIG. 2 is a circuit diagram of a current detection circuit according to a second embodiment.
Figure 3:
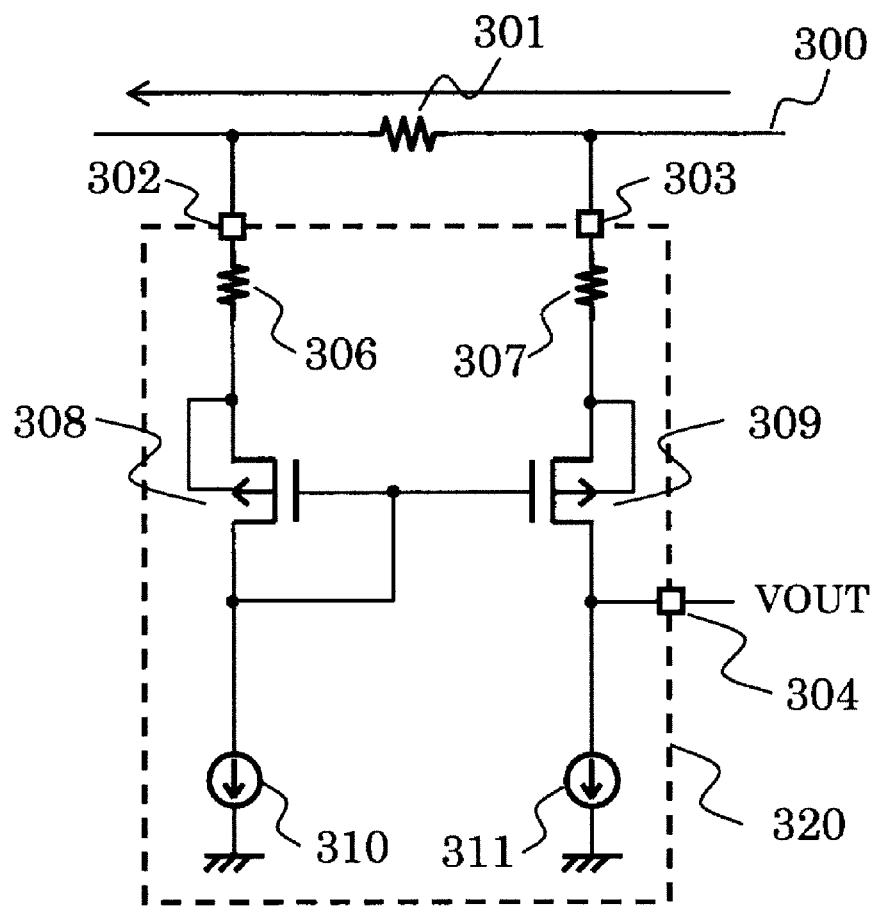
FIG. 3 is a circuit diagram of a related art current detection circuit.

FIG. 2 is a circuit diagram of a current detection circuit according to a second embodiment. A difference from the current detection circuit according to the first embodiment is that a PMOS transistor 212 is provided instead of the NMOS transistor 112. The PMOS transistor 212 has a source connected to a non-inversion input terminal 103, and a gate and a drain connected to a source of a PMOS transistor 108. A substrate is connected to the highest power supply within the circuit.

Since the PMOS transistor 212 is connected, a voltage drop of a gate voltage $V_{G1}$ of the PMOS transistor 108 and a PMOS transistor 109 is limited. The PMOS transistor 212 has transistor characteristics which allow a sufficient current to flow. Assuming that the threshold voltage of the NMOS transistor 112 is |Vth|, the following equation is established:

$$V_{G1}'=(VIN+)-|V\text{th}|-V_{SG11}$$

Thus, the voltage drop is limited by this voltage. From the above, a source-gate voltage $V_{SG12}$ of the PMOS transistor 109 is represented by the following equation:

$$V_{SG12}'=V_{S1}-V_{G1}'=|V\text{th}|+V_{SG11}-I\times R$$

Thus, the source-gate voltage $V_{SG12}$ of the PMOS transistor 109 is prevented from becoming a voltage not greater than a constant value regardless of the current $I_S$ even when the current $I_S$ is increased to plus.

Thus, since a change in the characteristics of the PMOS transistor 109 of a differential amplifier due to NBTI is suppressed, the current detection circuit does not change the threshold value at which its output voltage is inverted. On the other hand, when the current $I_S$ is increased to minus, it does not affect the circuit operation of the current detection circuit.

As described above, according to the current detection circuit of the present embodiment, an effect is brought about that since it is possible to limit the voltage drop at the gate of the PMOS transistor according to the voltage of the non-inversion input terminal, the change in the characteristics of the PMOS transistor on the non-inversion input terminal side of the differential amplifier due to NBTI is suppressed, and hence the threshold value at which the output voltage of the current detection circuit is inverted is not changed.

What is claimed is:

1. A current detection circuit comprising:
   a sense resistor provided in a power supply line; and
   a differential amplifier which detects a current flowing through the power supply line by a voltage across the sense resistor,
   wherein the sense resistor is connected to an inversion input terminal and a non-inversion input terminal of the differential amplifier at both ends,
   wherein the differential amplifier includes a first resistor, a first PMOS transistor, and a first current source which are connected in series between the inversion input terminal and GND,
   wherein the differential amplifier includes a second resistor, a second PMOS transistor, and a second current source which are connected in series between the non-inversion input terminal and GND,
   wherein the first PMOS transistor has a gate and a drain connected to a gate of the second PMOS transistor,
   wherein the second PMOS transistor has a drain connected to an output terminal of the differential amplifier, and
   wherein a voltage limiting circuit which limits a voltage drop is provided between the non-inversion input terminal and a source of the first PMOS transistor.

2. The current detection circuit according to claim 1, wherein the voltage limiting circuit is an NMOS transistor which has a gate and a drain connected to the non-inversion input terminal, and a source connected to the source of the first PMOS transistor.

3. The current detection circuit according to claim 1, wherein the voltage limiting circuit is a third PMOS transistor which has a source connected to the non-inversion input terminal, and a gate and a drain connected to the source of the first PMOS transistor.

* * * * *